(12) United States Patent
Rho et al.

(10) Patent No.: US 12,272,760 B2
(45) Date of Patent: Apr. 8, 2025

(54) ASSEMBLY APPARATUS

(71) Applicant: LG ELECTRONICS INC., Seoul (KR)

(72) Inventors: Junghun Rho, Seoul (KR); Imdeok Jung, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/695,344

(22) PCT Filed: Oct. 18, 2021

(86) PCT No.: PCT/KR2021/014444
§ 371 (c)(1),
(2) Date: Mar. 25, 2024

(87) PCT Pub. No.: WO2023/068383
PCT Pub. Date: Apr. 27, 2023

(65) Prior Publication Data
US 2024/0332447 A1    Oct. 3, 2024

(51) Int. Cl.
*B23P 19/00*    (2006.01)
*H01L 21/67*    (2006.01)
(Continued)

(52) U.S. Cl.
CPC ........ *H01L 33/00* (2013.01); *H01L 21/67121* (2013.01); *H01L 21/68* (2013.01); *H01L 24/97* (2013.01); *H01L 25/0753* (2013.01)

(58) Field of Classification Search
CPC ............ H01L 25/0753; H01L 33/0093; H01L 33/0095; H01L 24/75; H01L 2224/16238;
(Continued)

(56) References Cited

U.S. PATENT DOCUMENTS 6,170,622 B1 * 1/2001 Wakui .................. F16F 15/027
267/136
6,359,679 B1 * 3/2002 Ito .......................... G03B 27/62
355/75
(Continued)

FOREIGN PATENT DOCUMENTS

CN        110060705 A        7/2019
CN        112531088 A        3/2021
(Continued)

OTHER PUBLICATIONS

International Search Report, issued in PCT/KR2021/014444, PCT/ISA/210, dated Jul. 13, 2022.

*Primary Examiner* — Paul D Kim
(74) *Attorney, Agent, or Firm* — Birch, Stewart, Kolasch & Birch, LLP

(57) ABSTRACT

The assembly apparatus comprises: a main frame; a magnet head arranged on the main frame so that a semiconductor light-emitting element is self-assembled on a panel; and a vibration isolator arranged on the main frame to offset vibration of the magnet head, wherein the magnet head comprises a magnet plate assembly, which includes a magnet applying an attractive force to the semiconductor light-emitting element, and the vibration isolator comprises a weight positioned on the magnet plate assembly and may minimize the transmission, to the main frame, of vibration generated by the magnet head.

20 Claims, 12 Drawing Sheets

(51) Int. Cl.
*H01L 21/68* (2006.01)
*H01L 23/00* (2006.01)
*H01L 33/00* (2010.01)
*H05K 13/04* (2006.01)
*H01L 25/075* (2006.01)

(58) Field of Classification Search
CPC ....... H01L 2224/2929; H01L 2224/293; H01L 2224/32225; H01L 2224/75655; H01L 2224/75723; H01L 2224/75735; H01L 2224/83203; H01L 2224/83851; H01L 2224/95; H01L 2224/95085; H01L 2224/95133; H01L 2924/00014
See application file for complete search history.

(56) References Cited

U.S. PATENT DOCUMENTS

| | | | |
|---|---|---|---|
| 6,560,857 B1 | 5/2003 | Waitl et al. | |
| 11,502,055 B2 * | 11/2022 | Cho | H01L 25/0753 |
| 2005/0119795 A1 * | 6/2005 | Morisada | F16F 15/02 |
| | | | 700/280 |
| 2020/0279826 A1 | 9/2020 | Cho et al. | |
| 2021/0090909 A1 | 3/2021 | Yang et al. | |
| 2021/0090924 A1 | 3/2021 | Yang et al. | |
| 2021/0136966 A1 | 5/2021 | Jang et al. | |
| 2021/0320222 A1 | 10/2021 | Liao et al. | |

FOREIGN PATENT DOCUMENTS

| | | |
|---|---|---|
| KR | 2003-0080906 A | 10/2003 |
| KR | 10-0718202 B1 | 5/2007 |
| KR | 10-2009-0040688 A | 4/2009 |
| KR | 10-2016-0067484 A | 6/2016 |
| KR | 10-2019-0018385 A | 2/2019 |
| KR | 10-2020-0026762 A | 3/2020 |
| KR | 10-2145016 B1 | 8/2020 |
| KR | 10-2021-0093944 A | 7/2021 |

* cited by examiner

[FIG. 1]
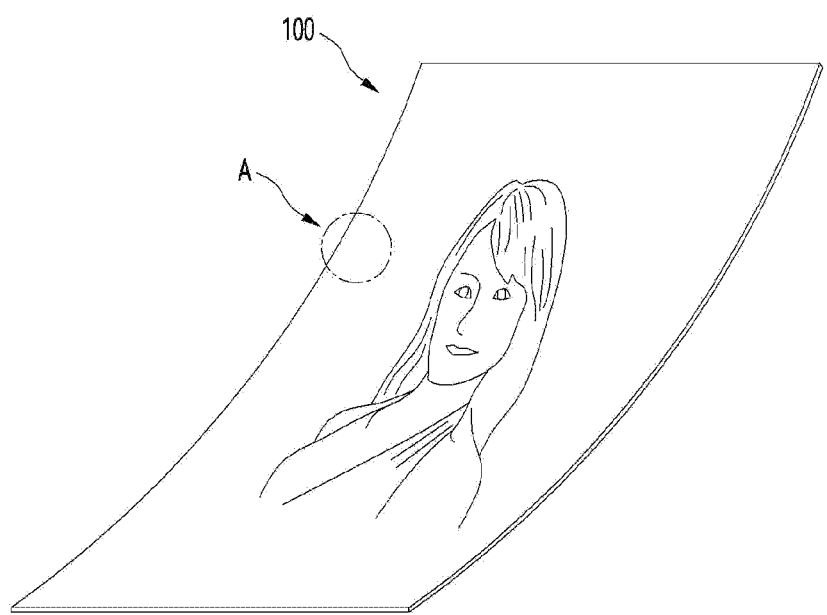
[FIG. 2]
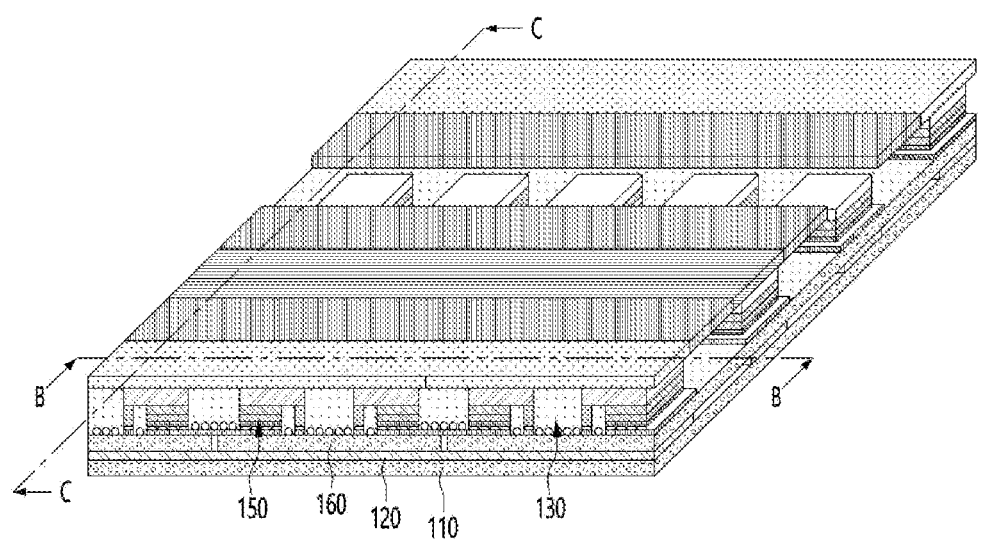

[FIG. 3a]
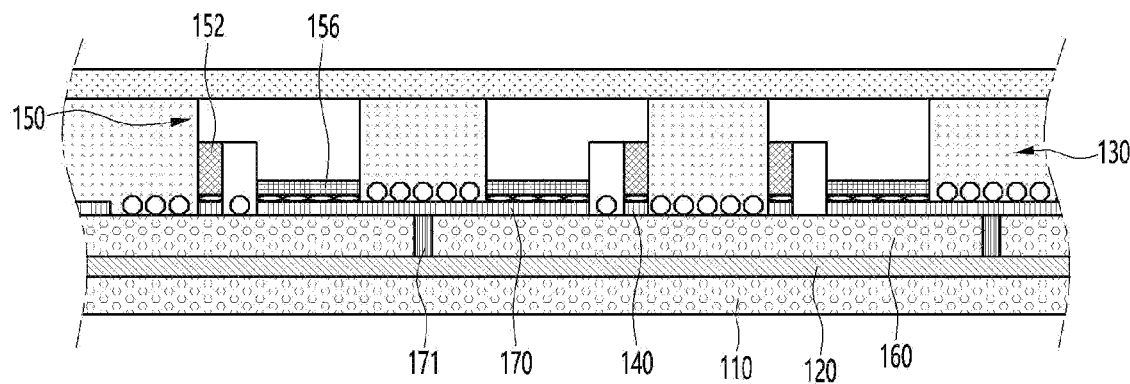
[FIG. 3b]
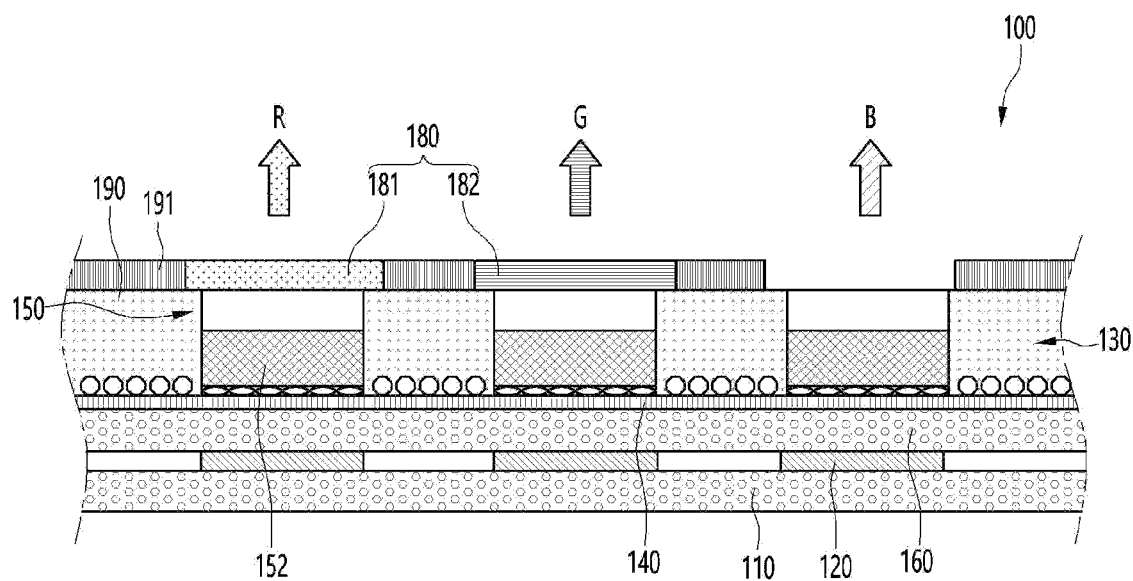

【FIG. 4】
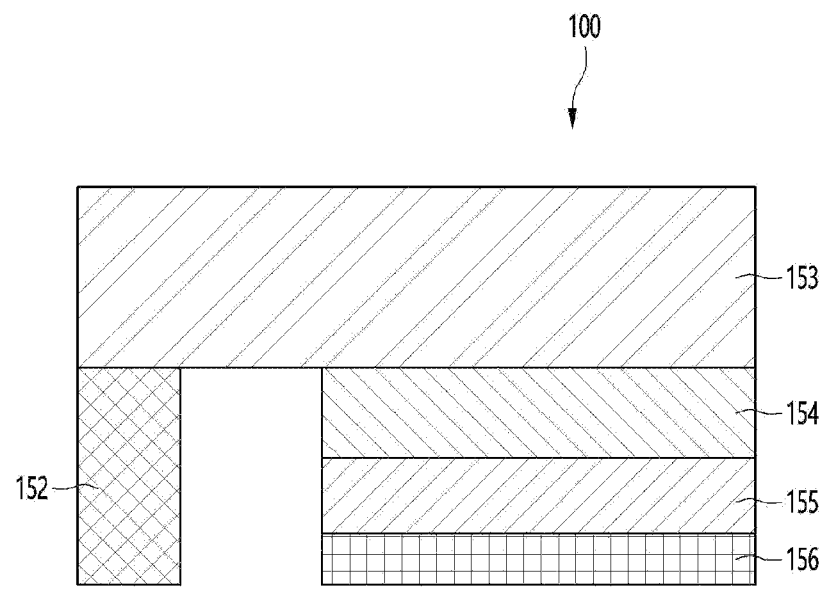
【FIG. 5a】
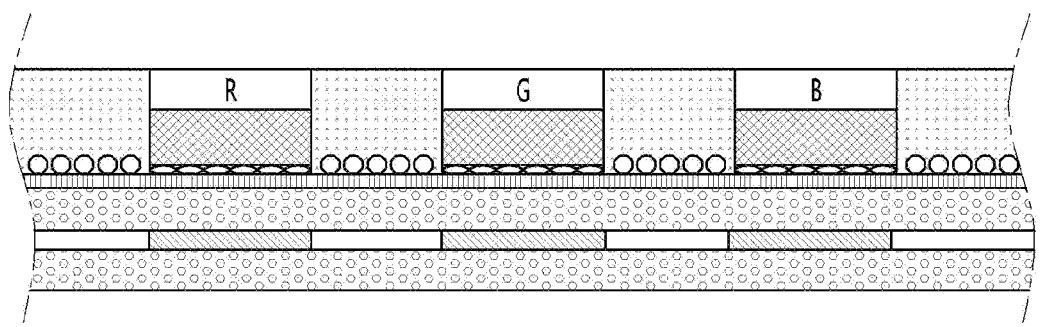

[FIG. 5b]
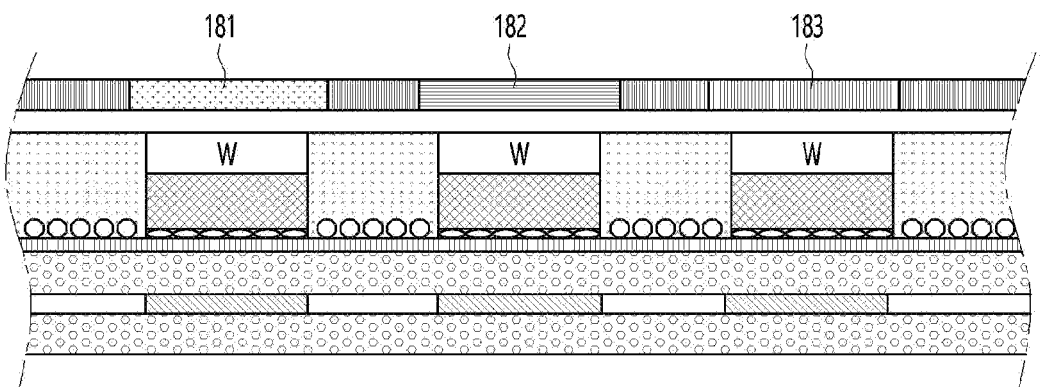
[FIG. 5c]
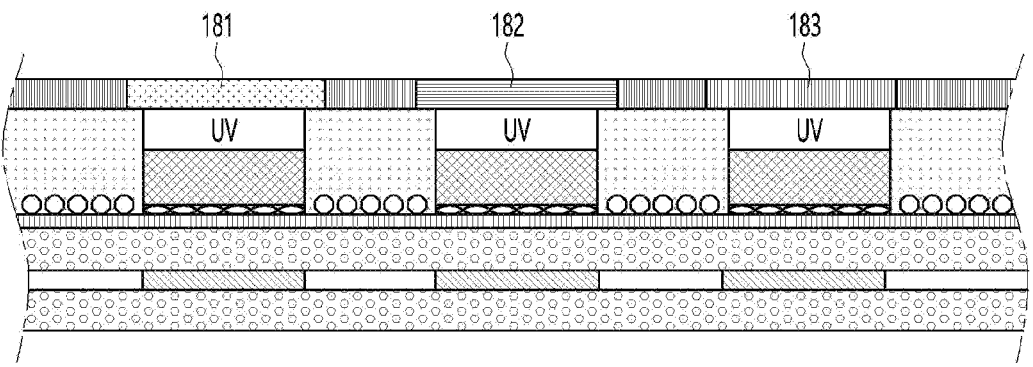

【FIG. 6】
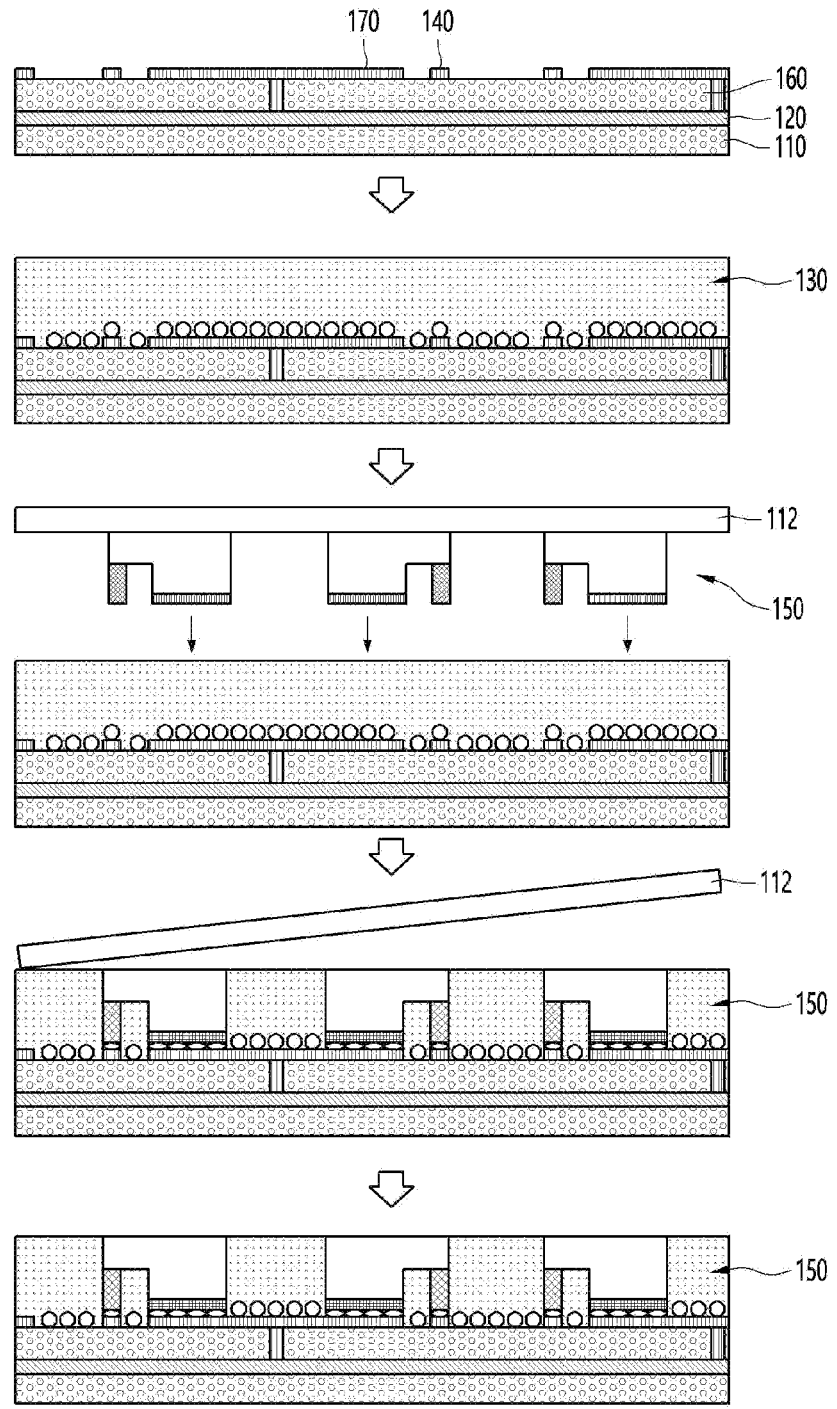

[FIG. 7]
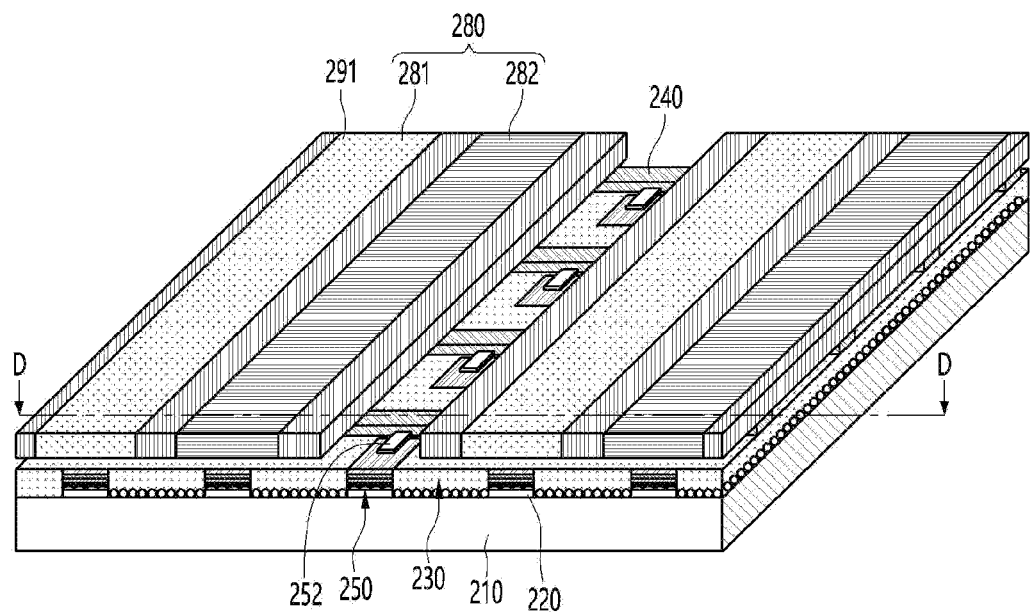
[FIG. 8]
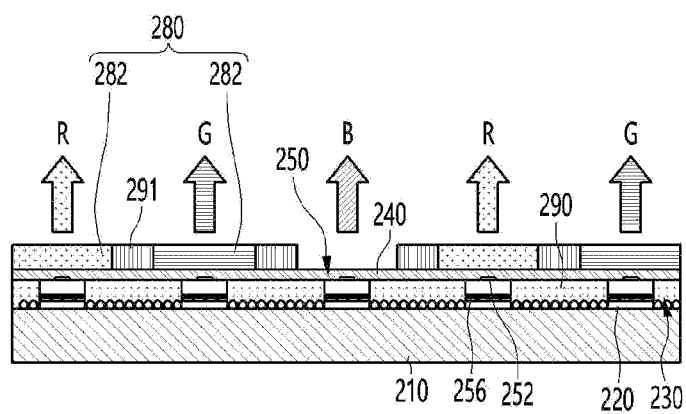

[FIG. 9]
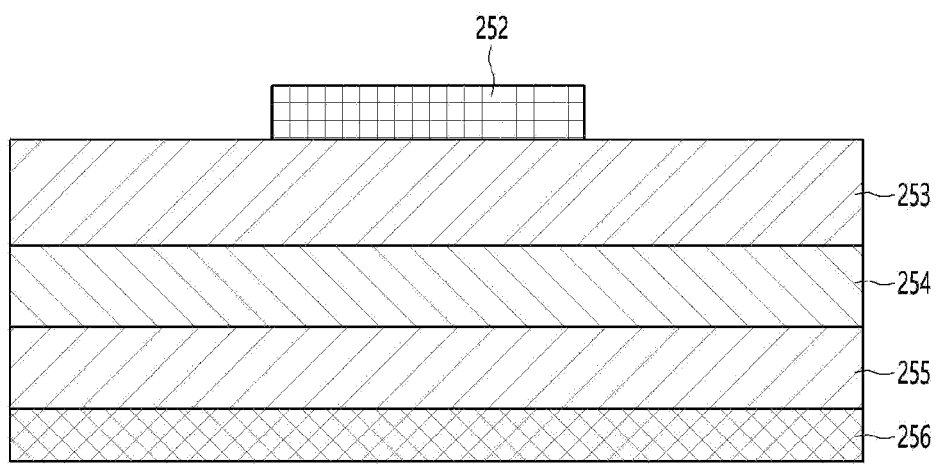
[FIG. 10]
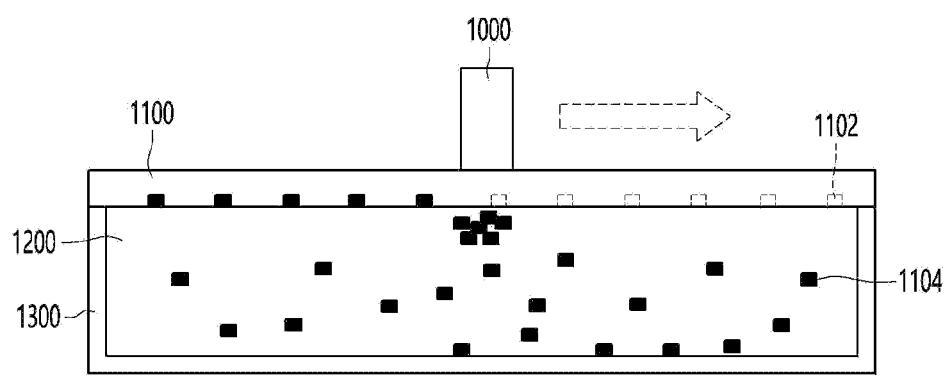

[FIG. 11]
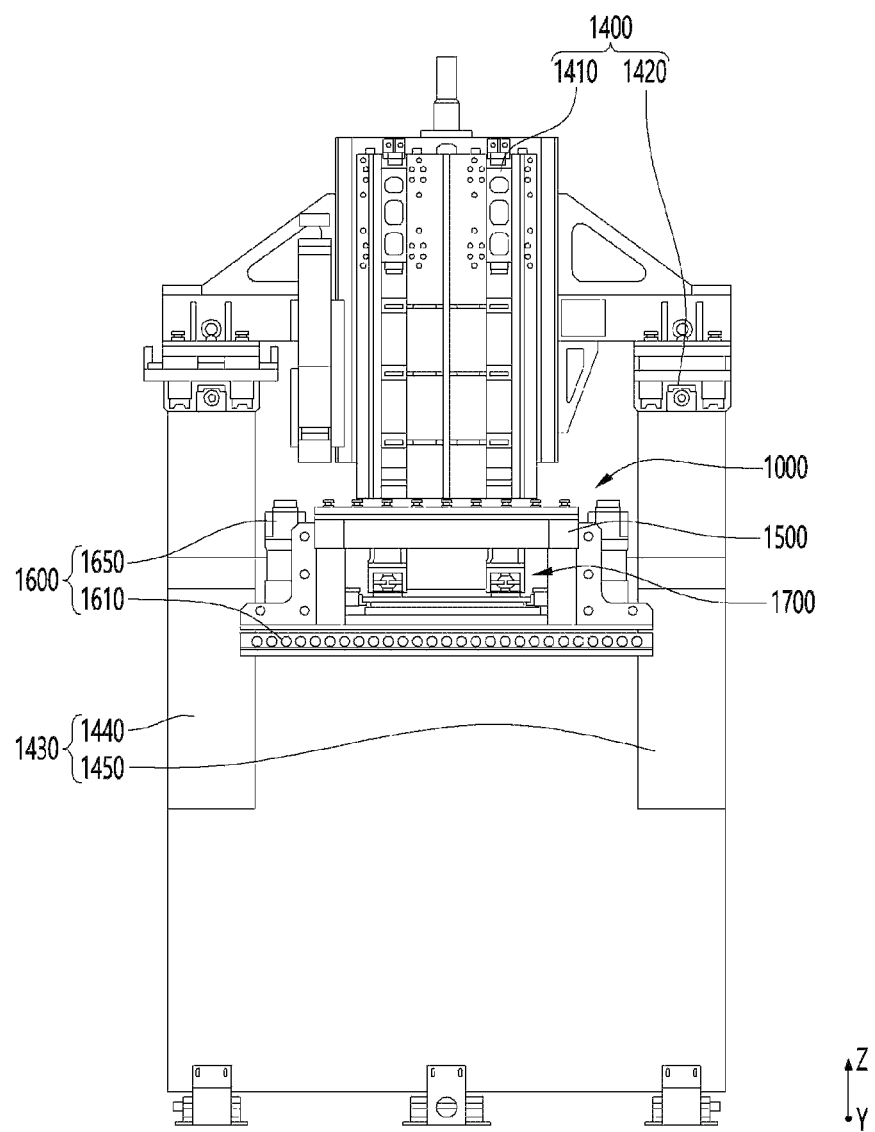

【FIG. 12】
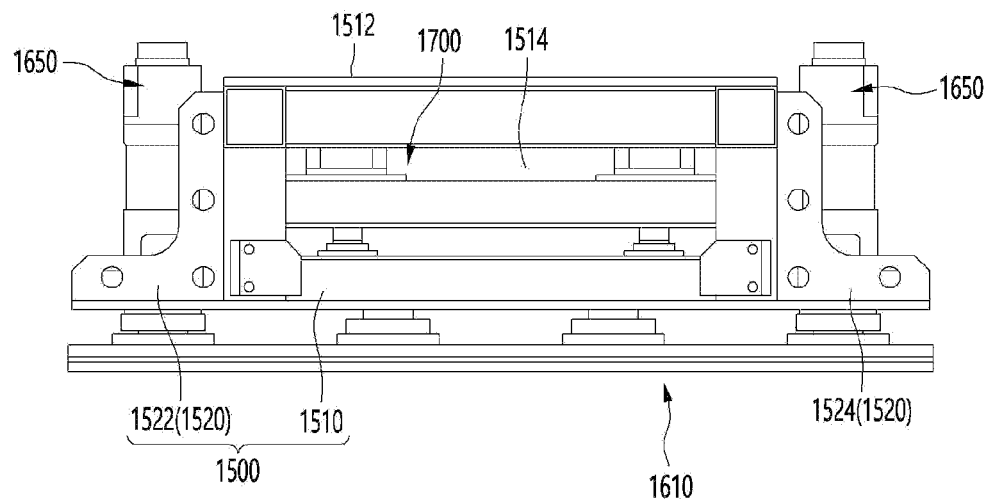
【FIG. 13】
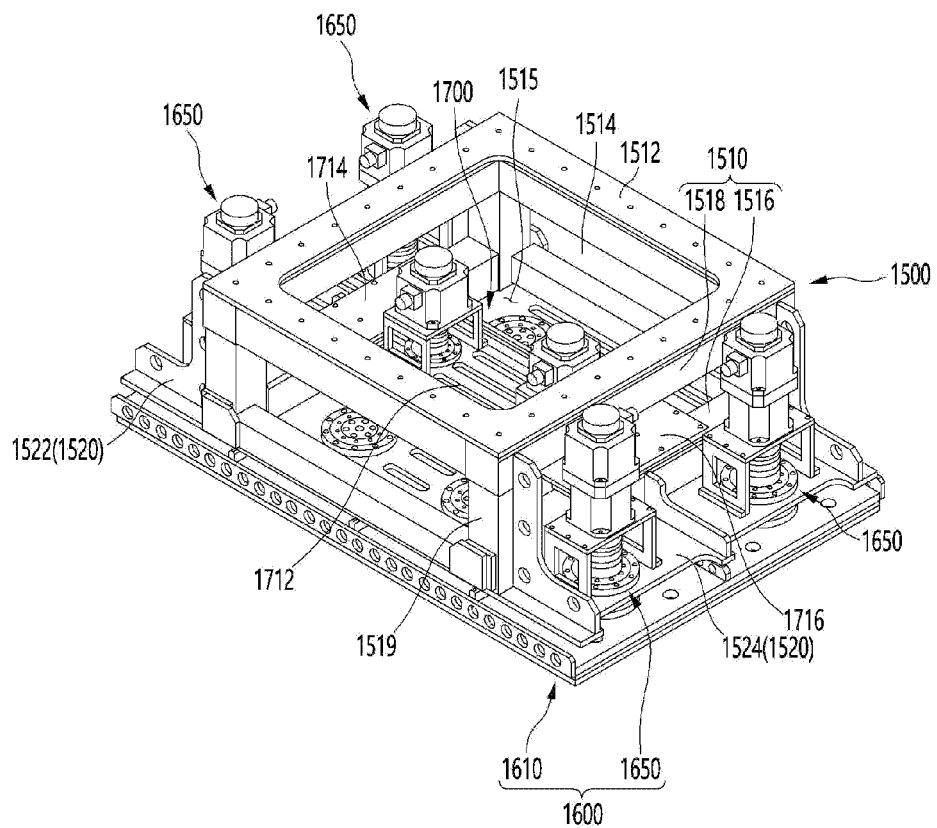

[FIG. 14]
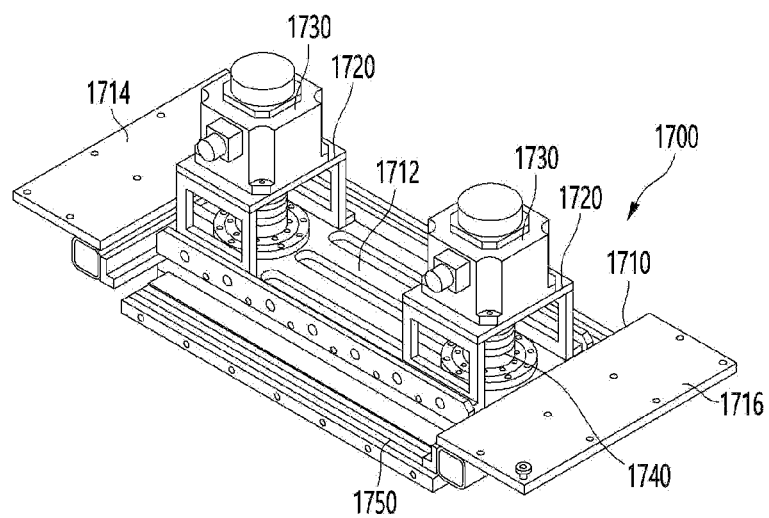
[FIG. 15]
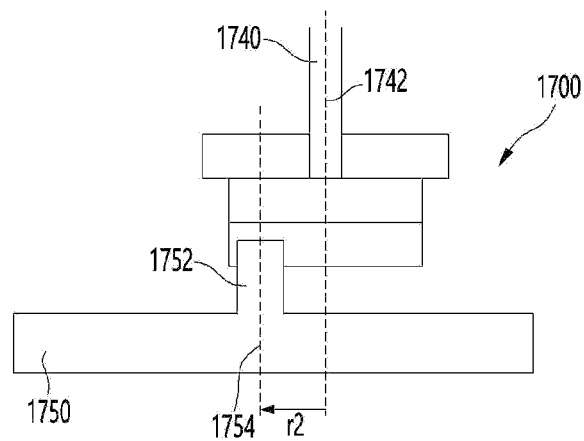

[FIG. 16]
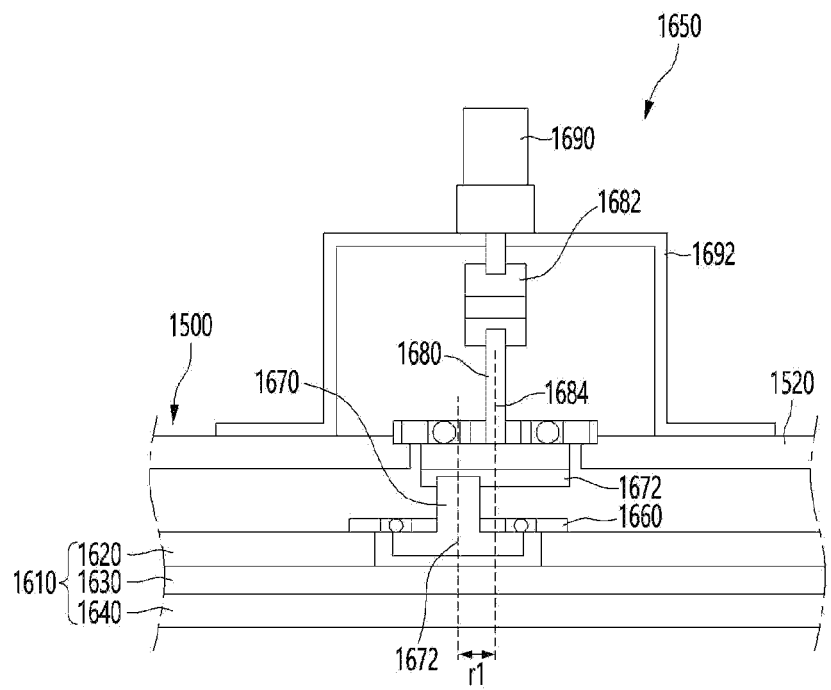
[FIG. 17]
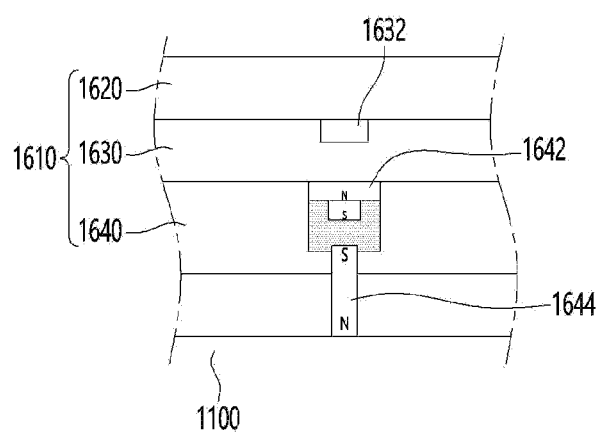

[FIG. 18]
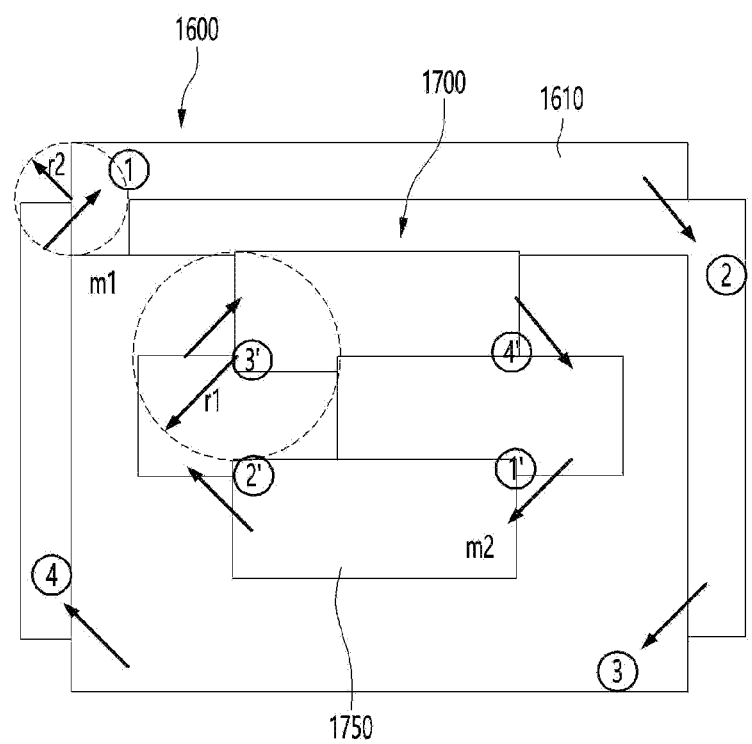

ASSEMBLY APPARATUS

CROSS REFERENCE TO RELATED APPLICATIONS

This application is the National Phase of PCT/KR2021/014444 filed on Oct. 18, 2021, which is hereby expressly incorporated by reference into the present application.

TECHNICAL FIELD

The present disclosure relates to an assembly apparatus, and more particularly, to an assembly apparatus for assembling a semiconductor light emitting diode with a display panel.

BACKGROUND ART

Recently, displays having excellent characteristics such as a thin shape and flexibility have been developed in the display technology field. On the other hand, a liquid crystal display (LCD) and active-matrix organic light emitting diodes (AMOLED) are representative of main displays that are commonly used now.

However, the LCD has a problem that a response time is not short and it is difficult to implement flexibility and AMOLED has a defect that the lifespan is short and the yield is not good.

Meanwhile, a light emitting diode (LED), which is a well-known semiconductor device that converts a current into light, has been used as a light source for displaying images in electronic devices comprising information devices together with a green LED based on GaP:N since a red LED using a GaAsP compound semiconductor was commercialized in 1962. Accordingly, a plan that solves the problems by implementing a display using the semiconductor LED may be proposed. Such an LED has the advantage of a long lifespan, low power consumption, an excellent initial driving characteristic, high vibration resistance, etc, as compared with a filament-based light emitting element.

In the case of a display using a semiconductor light emitting diode, the semiconductor light emitting diode corresponding to each pixel needs to be coupled to a substrate, and thus it may be relatively difficult to implement a large screen and high pixel display. Therefore, recently, a self-assembly method has been developed in which semiconductor light emitting diodes introduced into a fluid are moved to a substrate using an electromagnetic field and then assembled.

DISCLOSURE

Technical Problem

An object of the present disclosure is to an assembly apparatus in which vibration generated from a magnet head is minimized to be transmitted to a main frame.

An object of the present disclosure is to an assembly apparatus for improving the durability of a driver for driving a magnet head and a support.

Technical Solution

In an aspect of the present disclosure, an assembly apparatus comprises a main frame, a magnet head located on the main frame and configured to magnetically assemble a semiconductor light emitting diode to a panel, and an anti-vibration system located on the main frame and configured to offset vibration of the magnet head.

The magnet head may comprise a magnet plate assembly comprising a magnet configured to apply an attractive force to the semiconductor light emitting diode, and the anti-vibration system may comprise a weight positioned above the magnet plate assembly.

The magnet head may move the magnet plate assembly along a first circular trajectory, the anti-vibration system may move the weight along a second circular trajectory, the first circular trajectory may have a first radius, the second circular trajectory may have a second radius, and the second radius may be greater than the first radius.

The anti-vibration system may comprise an anti-vibration frame coupled to the main frame, a bracket installed on the anti-vibration frame, an anti-vibration motor installed in the bracket, an anti-vibration shaft rotated by the anti-vibration motor, and a weight eccentrically connected to the anti-vibration shaft.

The magnet head may comprise a magnet plate assembly, and a plurality of driving devices connected to the magnet plate assembly and spaced apart from each other.

The main frame may comprise an inner frame, and a side frame protruding from the inner frame and a side frame protruding from the inner frame.

The anti-vibration system may be located inside the inner frame, and the plurality of driving devices may each be located on the side frame.

Each of the plurality of driving devices may comprise a bearing installed on the magnet plate assembly, an eccentric shaft supported by the bearing, a lower coupler having the eccentric shaft eccentrically connected thereto, a driving shaft connected to the lower coupler, an upper coupler connected to the driving shaft, and a head motor configured to rotate the upper coupler.

An eccentric distance between the weight and the anti-vibration shaft may be greater than an eccentric distance between the eccentric shaft and the driving shaft.

The anti-vibration shaft and the driving shaft may be parallel to each other.

A rotation direction of the anti-vibration shaft and a rotation direction of the driving shaft may be the same.

Advantageous Effects

According to an embodiment of the present disclosure, an anti-vibration system may offset vibration of a magnet head, thereby minimizing vibration transmitted to a main frame when a magnet head operates.

The anti-vibration system may be protected by a magnet plate assembly by locating a weight on the magnet plate assembly.

A second radius of a second circular trajectory along which a weight is moved may be formed to be greater than a first radius of a first circular trajectory along with the magnet plate assembly is moved, and thus vibration may be minimized and the weight of the weight may also be minimized.

The anti-vibration system may be located inside an inner frame of the main frame and protected by the inner frame.

DESCRIPTION OF DRAWINGS

FIG. 1 is a conceptual view showing an embodiment of a display using a semiconductor light emitting diode of the present disclosure.

FIG. 2 is a partial enlarged view of the portion A of FIG. 1 and FIGS. 3A and 3B are cross-sectional views taken along line B-B and C-C of FIG. 2.

FIG. 4 is a conceptual view showing a flip-chip type semiconductor light emitting diode of FIG. 3.

FIGS. 5A to 5C are conceptual views showing various types that implement colors in relation to a flip-chip type semiconductor light emitting diode.

FIG. 6 shows cross-sectional views illustrating a method of manufacturing a display using a semiconductor light emitting diode of the present disclosure.

FIG. 7 is a perspective view showing another embodiment of a display using a semiconductor light emitting diode of the present disclosure.

FIG. 8 is a cross-sectional view taken along line D-D of FIG. 7.

FIG. 9 is a conceptual view showing a vertical semiconductor light emitting diode of FIG. 8.

FIG. 10 is a schematic diagram showing an embodiment of a method of assembling a semiconductor light emitting diode to a display panel by a self-assembly method.

FIG. 11 is a front view of an assembly system according to an embodiment of the present disclosure.

FIG. 12 is a side view of the assembly device shown in FIG. 11.

FIG. 13 is a perspective view of the assembly device shown in FIG. 11.

FIG. 14 is a perspective view of the anti-vibration system illustrated in FIG. 13.

FIG. 15 is a cross-sectional view of an anti-vibration system according to the present embodiment.

FIG. 16 is a cross-sectional view of a magnetic head according to the present embodiment.

FIG. 17 is a cross-sectional view illustrating the inside of a magnet plate assembly according to the present embodiment.

FIG. 18 is a view illustrating a vibration offset principle of an anti-vibration system according to the present embodiment.

BEST MODE

Hereafter, embodiments of the present disclosure will be described in detail with reference to the accompanying drawings and the same or similar components are given the same reference numerals regardless of the numbers of figures and are not repeatedly described. Terms "module" and "unit" that are used for components in the following description are used only for the convenience of description without having discriminate meanings or functions. In the following description, if it is decided that the detailed description of known technologies related to the present disclosure makes the subject matter of the embodiments described herein unclear, the detailed description is omitted. Further, it should be noted that the accompanying drawings are provided only for easy understanding of the embodiments disclosed herein and the spirit of the present disclosure should not be construed as being limited to the accompanying drawings.

When an element such as a layer, a region, or a substrate is referred to as being "on," another element, it may be directly on the other element, or an intervening element may be present therebetween.

A display described herein may comprise a mobile phone, a smart phone, a laptop computer, a digital broadcasting terminal, a PDA (personal digital assistants), a PMP (portable multimedia player), a navigation, a slate PC, a tablet PC, a ultra book, a digital TV, a desktop computer, etc. However, it would be easily understood by those skilled in the art that the configuration according to embodiments described here may be applied to devices that may be equipped with a display, even if the devices are new types of products that will be developed in future.

Before an assembly apparatus for assembling a semiconductor light emitting diode to a display panel (substrate) according to an embodiment of the present disclosure is described, a semiconductor light emitting diode and a display using the semiconductor light emitting diode are described.

FIG. 1 is a conceptual diagram showing an embodiment of a display using a semiconductor light emitting diode of the present disclosure.

Referring to the figure, information that is processed by a controller of a display 100 may be displayed using a flexible display.

The flexible display comprises displays that may be bent, curved, twisted, folded, and rolled by external force. For example, the flexible display may be a display that is manufactured on a thin and flexible substrate, which may be bent, curved, folded, or rolled like paper, while maintaining the display characteristics of existing flat panel display.

In a state in which the flexible display is not bent (e.g., in which the flexible display has an infinite radius of curvature, which is referred to as a 'first state' hereafter), the display region of the flexible display becomes a flat surface. In a state in which the flexible display is bent from the first state by external force (e.g., in which the flexible display has a finite radius of curvature, which is referred to as a 'second state' hereafter), the display region may be a curved surface. As shown in the figure, the information that is displayed in the second state may be visual information that is output on the curved surface. Such visual information is implemented by individual control of light emission of sub-pixels disposed in a matrix type. The sub-pixel means a minimum unit for implementing one color.

The sub-pixels of the flexible display may be implemented by a semiconductor light emitting diode. A light emitting diode (LED) that is a kind of semiconductor light emitting diode converting a current into light is exemplified in the present disclosure. The light emitting diode is formed in a small size, so it may function as a sub-pixel even in the second state.

Hereafter, a flexible display implemented using the light emitting diode is described in more detail with reference to drawings.

FIG. 2 is a partial enlarged view of the portion A of FIG. 1, FIGS. 3A and 3B are cross-sectional views taken along lines B-B and C-C of FIG. 2, FIG. 4 is a conceptual view showing a flip-chip type semiconductor light emitting diode of FIG. 3A, and FIGS. 5A to 5C are conceptual views showing various types that implement colors in relation to a flip-chip type semiconductor light emitting diode.

According to FIGS. 2, 3A, and 3B, as a display 100 using a semiconductor light emitting diode, a display 100 using a passive matrix (PM) type of semiconductor light emitting diode is exemplified. However, examples to be described hereafter may be applied also to an active matrix (AM) type of semiconductor light emitting diode.

The display 100 comprises a first substrate 110, a first electrode 120, a conductive adhesive layer 130, a second electrode 140, and a plurality of semiconductor light emitting diodes 150.

The substrate 110 may be a flexible substrate. For example, the substrate 110 may comprise glass or polyimide (PI) to implement a flexible display. Further, any materials may be used as long as they have insulation and flexibility such as PEN (Polyethylene Naphthalate) and PET (Polyethylene Terephthalate). Further, the substrate 110 may be made of any one of a transparent material or an opaque material.

The substrate 110 may be a wiring board on which the first electrode 120 is disposed, so the first electrode 120 may be positioned on the substrate 110

According to the drawings, an insulating layer 160 may be disposed over the substrate 110 on which the first electrode 120 is positioned, and an auxiliary electrode 170 may be positioned on the insulating layer 160. In this case, the state in which the insulating layer 160 is stacked on the substrate 110 may be one wiring board. In more detail, the insulating layer 160 may be made of an insulating and flexible material, such as PI (Polyimide), PET, and PEN, integrally with the substrate 110, thereby forming one substrate.

The auxiliary electrode 170, which is an electrode electrically connecting the semiconductor light emitting diodes 150, is positioned on the insulating layer 160 and disposed to correspond to the first electrode 120. For example, the auxiliary electrode 170 has a dot shape and may be electrically connected with the first electrode 120 by electrode holes 171 formed through the insulating layer 160. The electrode hole 171 may be formed by filing a via hole with a conductive material.

Referring to the figures, the conductive adhesive layer 130 is formed on a surface of the insulating layer 160, but the present disclosure is not necessarily limited thereto. For example, a structure, in which a layer performing a specific function is formed between the insulating layer 160 and the conductive adhesive layer 130 or the conductive adhesive layer 130 is disposed on the substrate 110 without the insulating layer 160, is possible. In the structure in which the conductive adhesive layer 130 is disposed on the substrate 110, the conductive adhesive layer 130 may function as an insulating layer.

The conductive adhesive layer 130 may be a layer having an adhesive property and conductivity, and to this end, a substance having conductivity and a substance having an adhesive property may be mixed in the conductive adhesive layer 130. Further, the conductive adhesive layer 130 has ductility, so it enables the flexible function of the display.

As an example of this case, the conductive adhesive layer 130 may be an anisotropy conductive film (ACF), an anisotropy conductive paste, and a solution containing conductive particles. The conductive adhesive layer 130 may be configured as a layer that allows for electrical connection in a Z direction passing through the thickness, but has electrical insulation in the horizontal X-Y direction. Accordingly, the conductive adhesive layer 130 may be referred to as a Z-axial conductive layer (however, hereafter, referred to as a 'conductive adhesive layer').

The anisotropic conductive film is a film in which an anisotropic conductive medium is mixed in an insulating base member, and only a specific portion is given conductivity by the anisotropic conductive medium when heat and pressure are applied. It is assumed in the following description that heat and pressure are applied to the anisotropic conductive film, but other methods are also possible so that the anisotropic conductive film partially has conductivity. These methods, for example, may be a case of applying only any one of heat and pressure or a case of UV curing.

Further, the anisotropic conductive medium, for example, may be a conductive ball or a conductive particle. According to the figures, in this embodiment, the anisotropic conductive film is a film in which conductive balls are mixed in an insulating base member, and only a specific portion is given conductivity by the conductive balls when heat and pressure are applied. The anisotropic conductive film may be in a state in which a plurality of particles coated with an insulating film made of a polymer material is contained in a core made of a conductive substance, and in this case, when heat and pressure are applied a portion, the insulating film is broken at the portion and the portion is given conductivity by the core. In this case, the shape of the core is deformed, so layers that are in contact with each other in the thickness direction of the film may be formed. As a more detailed example, heat and pressure are applied throughout the anisotropic conductive film and Z-axial electrical connection is partially formed by the height difference of an object that is bonded by the anisotropic conductive film.

As another example, the anisotropic conductive film may be in a state in which a plurality of particles coated with a conductive substance is contained in an insulating core. In this case, when heat and pressure are applied to a portion, the conductive substance at the portion is deformed (gets scored and sticks), so the portion is given conductivity in the thickness direction of the film. As another example, the conductive substance may pass through the insulating base member in the Z-axial direction to show conductivity in the thickness direction of the film. In this case, the conductive substance may have a pointed end.

According to the figures, the anisotropic conductive film may be a fixed array ACF in which conductive balls are inserted in a surface of an insulating base member. In more detail, the insulating base member is made of an adhesive substance, the conductive balls are concentrated at the bottom of the insulating base member, and when heat and pressure are applied to the base member, the base member is deformed with the conductive balls, thereby being given vertical conductivity.

However, the present disclosure is not limited thereto, and the anisotropic conductive film may be configured in a type in which conductive balls are randomly mixed in an insulating base member or a type in which a plurality of layers is provided and conductive balls are disposed in any one layer (double-ACF).

The anisotropic conductive paste is formed by combining a paste and conductive balls, and may be a paste in which conductive balls are mixed in an insulating and adhesive base substance. Further, the solution containing conductive particles may be a solution containing conductive particles or nano particles.

Referring to figures again, the second electrode 140 is spaced apart from the auxiliary electrode 170 and positioned on the insulating layer 160. That is, the conductive adhesive layer 130 is disposed on the insulating layer 160 on which the auxiliary electrode 170 and the second electrode 140 are positioned.

When the conductive adhesive layer 130 is formed in a state in which the auxiliary electrode 170 and the second electrode 140 are positioned on the insulating layer 160, and then the semiconductor light emitting diode 150 is connected in a flip-chip type by applying heat and pressure, the semiconductor light emitting diode 150 is electrically connected with the first electrode 120 and the second electrode 140.

Referring to FIG. 4, the semiconductor light emitting diode may be a flip-chip type light emitting diode.

For example, the semiconductor light emitting diode comprises a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 horizontally spaced apart from the p-type electrode 156 on the n-type semiconductor layer 153. In this case, the p-type electrode 156 may be electrically connected with the auxiliary electrode 170 by the conductive adhesive layer 130, and the n-type electrode 152 may be electrically connected with the second electrode 140.

Referring to FIGS. 2, 3A, and 3B again, the auxiliary electrode 170 is elongated in one direction and at least one auxiliary electrode may be electrically connected with a plurality of semiconductor light emitting diodes 150. For example, the p-type electrodes of semiconductor light emitting diodes at left and right sides from an auxiliary electrode may be electrically connected with one auxiliary electrode.

In more detail, the semiconductor light emitting diode 150 is pressed into the conductive adhesive layer 130 by heat and pressure, so only the portion between the p-type electrode 156 of the semiconductor light emitting diode 150 and the auxiliary electrode 170 and the portion between the n-type electrode 152 of the semiconductor light emitting diode 150 and the second electrode 140 have conductivity, and the other portions do not have conductivity because the semiconductor light emitting diode is pressed inside. As described above, the conductive adhesive layer 130 not only couples, but also electrically connects the portion between the semiconductor light emitting diode 150 and the auxiliary electrode 170 and the portion between the semiconductor light emitting diode 150 and the second electrode 140.

Further, the plurality of semiconductor light emitting diodes 150 constitutes a light emitting diode array, and a fluorescent layer 180 is formed on the light emitting diode array.

The light emitting diode array may comprise a plurality of semiconductor light emitting diodes having different own luminance values. Each of the semiconductor light emitting diode 150 constitutes a sub-pixel and is electrically connected to the first electrode 120. For example, the first electrode 120 may be a plurality of pieces, the semiconductor light emitting diodes, for example, may be arranged in several lines, and the semiconductor light emitting diodes in each line may be electrically connected to any one of the plurality of first electrodes.

Further, since the semiconductor light emitting diodes are connected in a flip-chip type, it is possible to use grown semiconductor light emitting diodes for a transparent dielectric substrate. Further, the semiconductor light emitting diodes, for example, may be nitride semiconductor light emitting diodes. Since the semiconductor light emitting diode 150 has excellent luminance, it may constitute an individual sub-pixel even in a small size.

According to the figures, a separation wall 190 may be formed between the semiconductor light emitting diodes 150. In this case, the separation wall 190 may serve to separate individual sub-pixels and may be formed integrally with the conductive adhesive layer 130. For example, the semiconductor light emitting diodes 150 are inserted in the anisotropic conductive film, the base member of the anisotropic conductive film may form the separation wall.

Further, when the base member of the anisotropic conductive film is black, the separation wall 190 may have a reflective characteristic and the contrast may be increased even without a discrete black insulator.

As another example, a reflective separation wall may be provided as the separation wall 190. In this case, the separation wall 190 may comprise a black or white insulator, depending on the object of the display. When a separation wall of a white insulator is used, there may be an effect of increasing reflectivity, and when a separation wall of a black insulator, it is possible to have a reflective characteristic and increase contrast.

The fluorescent layer 180 may be positioned on the outer side of the semiconductor light emitting diode 150. For example, the semiconductor light emitting diode 150 is a blue semiconductor light emitting diode that emits blue light (B), and the fluorescent layer 180 performs a function of converting the blue light (B) into a color of a sub-pixel. The fluorescent layer 180 may be a red fluorescent body 181 or a green fluorescent body 182 that constitutes an individual pixel.

That is, the red fluorescent body 181 that may convert blue light into red light (R) may be stacked on a blue semiconductor light emitting diode at a position where a red sub-pixel is formed, and the green fluorescent body 182 that may convert blue light into green light (G) may be stacked on a blue semiconductor light emitting diode at a position where a green sub-pixel is formed. Further, only a blue semiconductor light emitting diode may be independently used a portion forming a blue sub-pixel. In this case, red (R), green (G), and blue (B) sub-pixels may form one pixel. In more detail, a fluorescent body having one color may be stacked along each line of the first electrode 120. Accordingly, in the first electrode 120, one line may be an electrode that controls one color. That is, red (R), green (G), and blue (B) may be sequentially disposed along the second electrode 140, whereby a sub-pixel may be implemented.

However, the present disclosure is not necessarily limited thereto, and red (R), green (G), and blue (B) sub-pixels may be implemented by combining the semiconductor light emitting diode 150 and a quantum dot (QD) instead of a fluorescent body.

Further, a black matrix 191 may be disposed between each of fluorescent bodies to improve contrast. That is, the black matrix 191 may improve the contrast of light and darkness.

However, the present disclosure is not necessarily limited thereto and another structure may be applied to implement blue, red, and green.

Referring to FIG. 5A, the semiconductor light emitting diodes 150 each may be implemented as a high-power light emitting diodes in which gallium nitride (GaN) is comprised as a main component and indium (In) and/or aluminum (Al) is added to emit various colors of light comprising blue.

In this case, the semiconductor light emitting diodes 150 may be red, green, and blue semiconductor light emitting diodes to from sub-pixels respectively. For example, red, green, and blue semiconductor light emitting diodes (R, G, B) are alternately disposed, and sub-pixels of red, green, and blue constitute one pixel by the red, green, and blue semiconductor light emitting diodes, whereby a full-color display may be implemented.

Referring to FIG. 5B, the semiconductor light emitting diode may have white light emitting diodes (W) each having a yellow fluorescent layer. In this case, in order to form a sub-pixel, a red fluorescent layer 181, a green fluorescent layer 182, and a blue fluorescent layer 183 may be disposed on the white light emitting diode (W). Further, a sub-pixel may be formed using a color filter in which red, green, and blue are repeated, on the white light emitting diode (W).

Referring to FIG. 5C, a structure in which a red fluorescent layer 181, a green fluorescent layer 182, and a blue fluorescent layer 183 are disposed on an ultraviolet light emitting diode (UV) may be possible. As described above, a semiconductor light emitting diode may be used in the entire region comprising not only the visual light, but also ultraviolet light (UV), and may be expanded in the type of a semiconductor light emitting diode that may use ultraviolet light (UV) as an excitation source of an upper fluorescent body.

Referring to this embodiment again, the semiconductor light emitting diode 150 is positioned on the conductive adhesive layer 130, thereby constituting a sub-pixel in the display. Since the semiconductor light emitting diode 150 has excellent luminance, it may constitute an individual sub-pixel even in a small size. The individual semiconductor light emitting diode 150 may have a size with one side of 80 µm or less and may be a rectangular or a square diode. When it is a rectangle, the size may be 20×80 µm or less.

Further, even using a square semiconductor light emitting diode 150 having one side length of 10 µm as a sub-pixel, sufficient brightness for forming a display is shown. Accordingly, for example, in a case in which the size of a sub-pixel is a rectangular pixel having one side of 600 µm and the other one side of 300 µm, the distance of a semiconductor light emitting diode is relatively sufficiently large. Accordingly, in this case, it is possible to implement a flexible display having high quality over HD quality.

The display using the semiconductor light emitting diode described above may be manufactured by a new type of manufacturing method. Hereafter, this manufacturing method is described with reference to FIG. 6.

FIG. 6 shows cross-sectional views illustrating a method of manufacturing a display using a semiconductor light emitting diode of the present disclosure.

Referring to this figure, first, the conductive adhesive layer 130 is formed on the insulating layer 160 on which the auxiliary electrode 170 and the second electrode 140 are positioned. The insulating layer 160 is stacked on the first substrate 110, thereby forming one substrate (wiring board). Further, the first electrode 120, the auxiliary electrode 170, and the second electrode 140 are disposed on the wiring board. In this case, the first electrode 120 and the second electrode 140 may be disposed perpendicular to each other. Further, in order to implement a flexible display, the first substrate 110 and the insulating layer 160 each may comprise glass or polyimide (PI).

The conductive adhesive layer 130, for example, may be implemented by an anisotropic conductive film, and to this end, an anisotropic conductive film may be applied to a substrate on which the insulating layer 160 is positioned.

Next, a second substrate 112 on which a plurality of semiconductor light emitting diodes 150, which correspond to the positions of the auxiliary electrodes 170 and the second electrodes 140 and constitute individual pixels, is positioned is disposed such that the semiconductor light emitting diodes 150 face the auxiliary electrodes 170 and the second electrodes 140.

In this case, the second substrate 112, which is a growing substrate for growing the semiconductor light emitting diodes 150, may be a spire substrate or a silicon substrate.

The semiconductor light emitting diodes have a gap and a size that may form a display when they are formed in a wafer unit, so they may be effectively used for a display.

Next, the wiring board and the second substrate 112 are thermally pressed. For example, the wiring board and the second substrate 112 may be thermally pressed using an ACF press head. The wiring board and the second substrate 112 are bonded by the thermal pressing. Only the portions among the semiconductor light emitting diode 150, the auxiliary electrode 170, and the second electrode 140 have conductivity by the characteristics of an anisotropic conductive film having conductivity by thermal pressing, so the electrodes and the semiconductor light emitting diodes 150 may be electrically connected. In this case, the semiconductor light emitting diodes 150 are inserted in the anisotropic conductive film, so separation walls may be formed between the semiconductor light emitting diodes 150.

Next, the second substrate 112 is removed. For example, it is possible to remove the second substrate 112 using Laser Lift-off (LLO) or Chemical Lift-off (CLO).

Finally, the semiconductor light emitting diodes 150 are exposed to the outside by removing the second substrate 112. If necessary, it is possible to form a transparent insulating layer (not shown) by coating the top of the wiring board, to which the semiconductor light emitting diodes 150 are coupled, with silicon oxide (SiOx), etc.

Further, a step of forming a fluorescent layer on a surface of the semiconductor light emitting diode 150 may be further comprised. For example, the semiconductor light emitting diode 150 may be a blue semiconductor light emitting diode that emits blue light (B), and a red fluorescent body or a green fluorescent body for converting the blue light (B) into the light of a sub-pixel may form a layer on a surface of the blue semiconductor light emitting diode.

The manufacturing method or structure of the display using a semiconductor light emitting diode described above may be modified in various ways. As an example, a vertical semiconductor light emitting diode may also be applied to the display described above. Hereafter, a vertical structure is described with reference to FIGS. 5 and 6.

Further, in the modification or embodiment to be described hereafter, the same or similar components are given the same or similar reference numerals, and the above description is referred to for the description.

FIG. 7 is a perspective view showing another embodiment of a display using a semiconductor light emitting diode of the present disclosure, FIG. 8 is a cross-sectional view taken along line D-D of FIG. 7, and FIG. 9 is a conceptual view showing a vertical semiconductor light emitting diode of FIG. 8.

Referring to these figures, the display may be a display that uses passive matrix (PM) type of vertical semiconductor light emitting diodes.

The display comprises a substrate 210, a first electrode 220, a conductive adhesive layer 230, a second electrode 240, and a plurality of semiconductor light emitting diodes 250.

The substrate 210, which is a wiring board on which the first electrode 220 is disposed, may comprise polyimide (PI) to implement a flexible display. Further, any materials may be used as long as they have insulation and flexibility.

The first electrode 220 is positioned on the substrate 210 and may be formed in a bar shape that is long in one direction. The first electrode 220 may be configured to function as a data electrode.

The conductive adhesive layer 230 is formed on the substrate 210 on which the first electrode 220 is positioned. Like a display to which flip-chip type light emitting diodes are applied, the conductive adhesive layer 230 may be an anisotropy conductive film (ACF), an anisotropy conductive paste, and a solution comprising conductive particles. However, in this embodiment, a case in which the conductive adhesive layer 230 is implemented by an anisotropic conductive film is exemplified.

An isotropic conductive film is positioned in a state in which the first electrode 220 is positioned on the substrate 210 and then the semiconductor light emitting diode 250 is connected by applying heat and pressure, the semiconductor light emitting diode 250 is electrically connected with the first electrode 220. In this case, it is preferable that the semiconductor light emitting diode 250 is disposed to be positioned on the first electrode 220.

The electrical connection, as described above, is generated because when heat and pressure are applied, the anisotropic conductive film partially has conductivity in the thickness direction. Accordingly, the anisotropic conductive film is divided into a portion having conductivity in the thickness direction and a portion not having conductivity in the thickness direction.

Further, since the anisotropic conductive film contains an adhesive component, the conductive adhesive layer 230 implements not only electrical connection, but also mechanical coupling between the semiconductor light emitting diode 250 and the first electrode 220.

As described above, the semiconductor light emitting diode 250 is positioned on the conductive adhesive layer 230, whereby it configures an individual pixel in the display. Since the semiconductor light emitting diode 250 has excellent luminance, it may constitute an individual sub-pixel even in a small size. The individual semiconductor light emitting diode 250 may have a size with one side of 80 μm or less and may be a rectangular or a square diode. When it is a rectangle, the size may be 20×80 μm or less.

The semiconductor light emitting diode 250 may be a vertical structure.

A plurality of second electrodes 240 disposed across the length direction of the first electrode 220 and electrically connected with the vertical semiconductor light emitting diodes 250 is positioned between the vertical semiconductor light emitting diodes.

Referring to FIG. 9, the vertical semiconductor light emitting diodes comprise a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 positioned at a lower portion may be electrically connected with the first electrode 220 by the conductive adhesive layer 230, and the n-type electrode 252 positioned at an upper portion may be electrically connected with the second electrode 240 to be described below. The semiconductor light emitting diode 250 has a large advantage in that electrodes may be disposed up and down, so the chip size may be reduced.

Referring to FIG. 8 again, a fluorescent layer 280 may be formed on a surface of the semiconductor light emitting diode 250. For example, the semiconductor light emitting diode 250 is a blue semiconductor light emitting diode 251 that emits blue light (B), and the fluorescent layer 280 for converting the blue light (B) into a color of a sub-pixel may be provided. In this case, the fluorescent layer 280 may be a red fluorescent 281 and a green fluorescent body 282 constituting an individual pixel.

That is, the red fluorescent body 281 that may convert blue light into red light (R) may be stacked on a blue semiconductor light emitting diode at a position where a red sub-pixel is formed, and the green fluorescent body 282 that may convert blue light into green light (G) may be stacked on a blue semiconductor light emitting diode at a position where a green sub-pixel is formed. Further, only a blue semiconductor light emitting diode may be independently used a portion forming a blue sub-pixel. In this case, red (R), green (G), and blue (B) sub-pixels may form one pixel.

However, the present disclosure is not necessarily limited thereto and other structures for implementing blue, green, and red, as described above, in a display to which flip-chip type light emitting diodes are applied may be applied.

According to this embodiment, the second electrodes 240 are disposed between the semiconductor light emitting diodes 250 and electrically connected with the semiconductor light emitting diodes. For example, the semiconductor light emitting diodes 250 may be disposed in a plurality of lines and the second electrodes 240 may be positioned between the lines of the semiconductor light emitting diodes 250.

Since the distance between the semiconductor light emitting diodes 250 that form individual pixels is sufficiently large, the second electrodes 240 may be positioned between the semiconductor light emitting diodes 250.

The second electrode 240 may be formed as an electrode in a bar shape that is long in one direction and may be disposed perpendicular to the first electrode.

Further, the second electrode 240 and the semiconductor light emitting diode 250 may be electrically connected by a connection electrode protruding from the second electrode 240. In more detail, the connection electrode may be the n-type electrode of the semiconductor light emitting diode 250. For example, the n-type electrode is formed as an ohmic electrode for ohmic contact and the second electrode covers at least a portion of the ohmic electrode by printing or depositing. Accordingly, the second electrode 240 and the n-type electrode of the semiconductor light emitting diode 250 may be electrically connected.

According to the figures, the second electrode 240 may be positioned on the conductive adhesive layer 230. Depending on cases, a transparent insulating layer (not shown) comprising silicon oxide (SiOx), etc may be formed on the substrate 210 on which the semiconductor light emitting diodes 250 are formed. When the second electrode 240 is positioned after the transparent insulating layer is formed, the second electrode 240 is positioned on the transparent insulating layer. Further, the second electrodes 240 may be formed to be spaced apart from each other on the conductive adhesive layer 230 or the transparent insulating layer.

If a transparent electrode such as ITO (Indium Tin Oxide) is used to position the second electrode 240 on the semiconductor light emitting diode 250, there is a problem in that the ITO substance is not bonded well to a semiconductor layer. Accordingly, the present disclosure has the advantage that there is no need for using a transparent electrode such as ITO by positioning the second electrode 240 between the semiconductor light emitting diodes 250. Accordingly, it is possible to improve optical extraction efficiency by using a conductive substance, which is bonded well to an n-type semiconductor layer, as a horizontal electrode without being limited to selection of a transparent material.

According to the figures, a separation wall 290 may be positioned between the semiconductor light emitting diodes 250. That is, the separation wall 290 may be disposed between the vertical semiconductor light emitting diodes 250 to isolate the semiconductor light emitting diodes 250 forming individual pixels. In this case, the separation wall 290 may serve to separate individual sub-pixels and may be formed integrally with the conductive adhesive layer 230. For example, the semiconductor light emitting diodes 250 are inserted in the anisotropic conductive film, the base member of the anisotropic conductive film may form the separation wall.

Further, when the base member of the anisotropic conductive film is black, the separation wall 290 may have a reflective characteristic and the contrast may be increased even without a discrete black insulator.

As another example, a reflective separation wall may be provided as the separation wall 190. The separation wall 290 may comprise a black or white insulator, depending on the object of the display.

If the second electrode 240 is positioned directly on the conductive adhesive layer 230 between the semiconductor light emitting diodes 250, the separation wall 290 may be positioned between each of the semiconductor light emitting diodes 250 and the second electrodes 240. Accordingly, there is an effect that it is possible to configure individual sub-pixels even in a small size using the semiconductor light emitting diodes 250, it is possible to position the second electrode 240 between the semiconductor light emitting diodes 250 because the distance of the semiconductor light emitting diodes 250 is relatively larger, and it is possible to implement a flexible display having HD quality.

Further, according to the figures, a black matrix 291 may be disposed between fluorescent bodies to improve contrast. That is, the black matrix 291 may improve the contrast of light and darkness.

As described above, the semiconductor light emitting diode 250 is positioned on the conductive adhesive layer 230, whereby it configures an individual pixel in the display. Since the semiconductor light emitting diode 250 has excellent luminance, it may constitute an individual sub-pixel even in a small size. Accordingly, a full-color display in which red (R), green (G), and blue (B) sub-pixels form one pixel by semiconductor light emitting diodes may be implemented.

<One Structure of Semiconductor Light Emitting Diode Having Magnetic Layer for Self-Assembly>

FIG. 10 is a schematic diagram showing an embodiment of a method of assembling a semiconductor light emitting diode to a display panel by a self-assembly method.

With reference to FIG. 10, an example of assembling a semiconductor light emitting diode to a display panel by a self-assembly method using an electromagnetic field will be briefly described.

Referring to FIG. 10, a semiconductor light emitting diode 1104 may be introduced into a chamber 1300 filled with a fluid 1200.

The semiconductor light emitting diode 1104 may be implemented as a horizontal-type semiconductor light emitting diode shown in FIG. 4 or a vertical-type semiconductor light emitting diode shown in FIG. 9. The semiconductor light emitting diode 1104 may comprise a magnetic layer having a magnetic material. The magnetic layer may comprise a metal having magnetism, such as nickel (Ni). The semiconductor light emitting diode 1104 introduced into a fluid comprises the magnetic layer, and thus may be moved to a panel 1100 by a magnetic field generated from an assembly apparatus 1000 to be assembled to the panel 1100.

Then, the panel 1100 (or substrate) may be located on the chamber 1300. In some embodiments, the panel 1100 may be introduced into the chamber 1300.

A pair of assembly electrodes (not shown) corresponding to each of the semiconductor light emitting diode 1104 to be assembled may be formed on the panel 1100. The assembly electrode may be implemented as a transparent electrode (ITO), or may be implemented using other general materials. As a voltage is applied to the assembly electrode, the assembly electrode may emit an electric field, and thus may correspond to a pair of assembly electrodes fixing the assembled semiconductor light emitting diode 1104 to the panel 1100. An interval between the assembly electrodes may be formed to be smaller than a width of the semiconductor light emitting diode 1104 and a width of a coupling hole 1102, thereby more precisely fixing an assembly position of the semiconductor light emitting diode 1104 using an electric field.

The coupling hole 1102 to which the semiconductor light emitting diodes 1104 are coupled may be formed in the panel 1100, and a surface of the panel 1100, in which the coupling hole 1102 is formed, may be in contact with the fluid 1200. The coupling hole 1102 may guide an accurate assembly position of the semiconductor light emitting diode 1104. For example, the coupling hole 1102 may be formed by a partition wall 190 (refer to FIG. 3B) formed on the substrate of the panel 1100.

The coupling hole 1102 may have a shape and a size corresponding to the shape of the semiconductor light emitting diode 1104 to be assembled at a corresponding position. Accordingly, another semiconductor light emitting diode may be prevented from being assembled in the coupling hole 1102 or a plurality of semiconductor light emitting diodes may be prevented from being assembled therein.

After the panel 1100 is located, the assembly apparatus 1000 comprising a magnetic body may move along the panel 1100. The assembly apparatus 1000 may move in contact with the panel 1100 to maximize an area of the fluid 1200, which is affected by a magnetic field. In some embodiments, the assembly apparatus 1000 may comprise a plurality of magnetic materials or may comprise a magnetic material having a size corresponding to that of the panel 1100. In this case, a movement distance of the assembly apparatus 1000 may be limited within a predetermined range.

Due to a magnetic field generated by the assembly apparatus 1000, the semiconductor light emitting diode 1104 in the chamber 1300 may move toward the assembly apparatus 1000.

The semiconductor light emitting diode 1104 may be inserted into the coupling hole 1102 while moving toward the assembly apparatus 1000 to be in contact with the panel 1100. For example, a pattern or a shape for contact of an n-type semiconductor layer of the semiconductor light emitting diode 1104 with the panel 1100 may be formed in the coupling hole 1102 and/or the semiconductor light emitting diode 1104.

Due to an electric field applied through an assembly electrode formed in the panel 1100, the semiconductor light emitting diode 1104 in contact with the panel 1100 may be fixed to the panel 1100 without being separated by movement of the assembly apparatus 1000. Accordingly, the semiconductor light emitting diode 1104 may be assembled to the panel 1100.

That is, the self-assembly method using the electromagnetic field may rapidly shorten a time required for each of the semiconductor light emitting diodes to be assembled to the substrate, and thus a large-area high-pixel display may be implemented more quickly and economically.

The semiconductor light emitting diode 1104 may be a micro-LED, and the assembly apparatus 1000 may comprise a micro-LED large-area self-assembly multi-magnet head.

FIG. 11 is a front view of an assembly system according to an embodiment of the present disclosure.

The assembly system shown in FIG. 11 may comprise the assembly apparatus 1000, a driver 1400, and a support 1430.

An example of the driver 1400 may be a robot that moves the assembly apparatus 1000.

The driver 1400 may comprise a Z-axis driver 1410 and a Y-axis driver 1420.

The Z-axis driver 1410 may be located on the support 1430, and may be connected to the assembly apparatus 1000 to move the assembly apparatus 1000 in the Z-axis (vertical direction).

The Y-axis driver 1420 may be located on the support 1430 and may move the Z-axis driver 1410 in the Y-axis (horizontal direction) orthogonal to the Z-axis.

The driver 1400 may move the assembly apparatus 1000 in a vertical direction and a horizontal direction while being supported by the support 1430.

The support 1430 may comprise a left support frame 1440 and a right support frame 1450.

The assembly apparatus 1000 may be moved on the panel 1100 by the driver 1400. The assembly apparatus 1000 may be moved on the panel 1100 by the driver 1400 in the Z-axis (vertical direction) and the Y-axis (horizontal direction).

Vibration generated by the assembly apparatus 1000 may be transmitted to the driver 1400 and the support 1430, and the assembly apparatus 1000 may comprise an anti-vibration device 1700 and may minimize transfer of vibration to the driver 1400 and the support 1430.

The assembly apparatus 1000 may comprise a main frame 1500, a magnet head 1600, and an anti-vibration system 1700.

The main frame 1500 may support the magnet head 1600 and the anti-vibration system 1700.

The main frame 1500 may be connected to the driver 1400 and transport the magnet head 1600 and the anti-vibration system 1700 when the driver 1400 is driven.

The main frame 1500 may be connected to the Z-axis driver 1410 of the driver 1400. The main frame 1500 may be installed to be suspended from the Z-axis driver 1410 below the Z-axis driver 1410.

The magnet head 1600 may be located on the main frame 1500, and the semiconductor light emitting diode 1104 (refer to FIG. 10) may be self-assembled to the panel 1100 (refer to FIG. 10).

The magnet head 1600 may comprise a magnet plate assembly 1610 and a plurality of driving devices 1650.

The magnet plate assembly 1610 may comprise an assembly magnet 1644 for applying an attractive force to the semiconductor light emitting diode 1104 (refer to FIG. 10) located within the chamber 1300.

The plurality of driving devices 1650 may be located apart from each other. The plurality of driving devices 1650 may each be connected to the magnet plate assembly 1610.

The plurality of driving devices 1650 may allow the magnet plate assembly 1610 to rotate along a circular trajectory, and the assembly apparatus 100 may be a multi-magnet head comprising the plurality of driving devices 1650.

Even if the size and assembly area of the panel 1100 are increased, the magnet head 100 may be simultaneously assembled to a large area of the panel 1100, and even if an assembly area of the panel 1100 is increased, the magnet may be located as much as the increased area, thereby assembling an entire area of the panel 1100 at the same time.

The anti-vibration system 1700 may be located on the main frame 1500 to offset vibration of the magnet head 1600. When the magnet plate assembly 1610 is rotated by the plurality of driving devices 1650, the anti-vibration system 1700 may the anti-vibration system 1700 may comprise a work (weight) for offsetting a force generated in a vertical direction of a rotation radius.

On the same axial line as the magnet head 1600, the anti-vibration system 1700 may rotate the work (weight) in synchronization with an eccentricity angle of the magnet head 1600 to generate a force opposite to the magnet head 1600.

The anti-vibration system 1700 may minimize a force transmitted from the magnet head 1600 to the main frame 1500, thereby minimizing transmission of vibration generated by the magnet head 1600 to the frame 1500.

FIG. 12 is a side view of the assembly device shown in FIG. 11, FIG. 13 is a perspective view of the assembly device shown in FIG. 11, FIG. 14 is a perspective view of the anti-vibration system illustrated in FIG. 13, FIG. 15 is a cross-sectional view of an anti-vibration system according to the present embodiment, FIG. 16 is a cross-sectional view of a magnetic head according to the present embodiment, and FIG. 17 is a cross-sectional view illustrating the inside of a magnet plate assembly according to the present embodiment.

As illustrated in FIGS. 12 and 13, the main frame 1500 may comprise an inner frame 1510, and a side frame 1520 protruding from the inner frame 1510.

The inner frame 1510 may be a center frame located between a pair of side frames 1520.

An upper end 1512 of the inner frame 1510 may be fastened to a lower end of the driver 1400, particularly, the Z-axis driver 1410.

The inner frame 1510 may be a frame having a hexagonal shape. An opening 1514 may be formed on each of a front surface, a rear surface, a left surface, and a right surface of the inner frame 1510.

A space 1515 may be formed inside the inner frame 1510.

The inner frame 1510 may comprise a lower frame 1516, an upper frame 1518 apart from the lower frame 1516 in the Z-axis direction, and a pillar frame 1519 connecting the lower frame 1516 to the upper frame 1518.

The side frame 1520 may protrude from a lower portion of the inner frame 1510 in a horizontal direction.

The side frame 1520 may be provided in a pair, and may be provided at both left and right sides of the inner frame 1510, respectively.

The pair of side frames 1520 may comprise a left frame 1522 and a right frame 1524 located with the inner frame 1520 located therebetween.

The left frame 1522 and the right frame 1524 may be located apart from each other in a left-right direction.

The anti-vibration system 1700 may be located in the space 1515 inside the inner frame 1510, and each of the plurality of driving devices 1650 may be located in the side frame 1520.

One example of the magnet head 1600 may comprise a total of four driving devices 1650, and in this case, two driving devices 1650 may be located in the left frame 1522, and the other two driving devices 1650 may be located in the right frame 1524.

The anti-vibration system 1700 may comprise an anti-vibration frame 1710 fastened to the main frame 1500, a bracket 1720 installed in the anti-vibration frame 1710, an anti-vibration motor 1730 installed in the bracket 1720, an anti-vibration shaft 1740 rotated by the anti-vibration motor 1730, and a weight 1750 eccentrically connected to the anti-vibration shaft 1740.

As shown in FIG. 14, the anti-vibration frame 1710 may comprise a center body 1712 and a pair of side bodies 1714 and 1716.

The center body 1712 may be elongated in a left-right direction.

The pair of side bodies 1714 and 1716 may be formed to be shorter than the center body 1712. The pair of side bodies 1714 and 1716 may comprise the left body 1714 and the right body 1716.

As shown in FIG. 13, the left body 1714 may be fastened to a left portion of a center frame 150, and the right body 1716 may be fastened to a right portion of the center frame 150.

The left body 1714 and the right body 1716 may be fastened to the lower frame 1516 of the center frame 150.

The bracket 1720 may be fastened to the center body 1712. The bracket 1720 may support the anti-vibration motor 1730 to be located apart from the center body 1720.

An upper portion of the anti-vibration shaft 1740 may be connected to an anti-vibration motor 1730, and when the anti-vibration motor 1730 is driven, the anti-vibration shaft 1740 may be rotated. The anti-vibration shaft 1740 may comprise a plurality of members, and may comprise at least one coupler.

The anti-vibration shaft 1740 may pass through the center body 1712 of the anti-vibration frame 1710.

The weight 1750 may be located below the center body 1712 of the anti-vibration frame 1710 and connected to the anti-vibration shaft 1740.

The weight 1750 may be connected to a portion other than a rotation center shaft 1742 of the anti-vibration shaft 1740, and when the anti-vibration shaft 1740 rotates around the rotation center shaft 1742, the weight 1750 may be rotated along a circular trajectory.

The weight 1750 may comprise a connection shaft 1752 eccentrically connected to the anti-vibration shaft 1740. The connection shaft 1752 may be connected to a portion other than the rotation center shaft 1742 of the anti-vibration shaft 1740.

The weight 1750 and the anti-vibration shaft 1740 may have a second eccentric distance r2. The second eccentric distance r2 may be defined as a horizontal distance between a center shaft 1754 of the connection shaft 1752 and the rotation center shaft 1742 of the anti-vibration shaft 1740.

Hereinafter, a detailed configuration of a driving device will be described with reference to FIG. 16.

As shown in FIG. 16, each of the plurality of driving devices 1650 may comprise a bearing 1660 installed in the magnet plate assembly 1610, an eccentric shaft 1670 supported by the bearing 1660, a lower coupler 1672 eccentrically connected to the eccentric shaft 1670, a driving shaft 1680 connected to the lower coupler 1680, an upper coupler 1682 connected to the driving shaft 1680, and a head motor 1690 rotating the upper coupler 1682.

The eccentric shaft 1670 may be connected to a portion other than a rotation center of the lower coupler 1672.

The eccentric shaft 1670 and the driving shaft 1680 may have a first eccentric distance r1. Here, the first eccentric distance r1 may be defined as a horizontal distance between a center shaft 1672 of the eccentric shaft 1670 and a rotation center shaft 1684 of the driving shaft 1680.

The head motor 1690 may be mounted on a head bracket 1692 installed in the side frame 1520 of the frame 1500. The head motor 1690 may be located on the side frame 1520 to be located apart from the side frame 1520.

The anti-vibration shaft 1740 of the anti-vibration system 1700 and the driving shaft 1680 of the driving mechanism 1650 may be parallel to each other, and a rotation direction of the anti-vibration shaft 174 and a rotation direction of the driving shaft 1680 may be the same.

When the anti-vibration shaft 174 is rotated clockwise, the driving shaft 1680 may be rotated clockwise, and when the anti-vibration shaft 174 is rotated counterclockwise, the driving shaft 1680 may be rotated counterclockwise.

The second eccentric distance r2 (refer to FIG. 15) between the weight 1750 and the anti-vibration shaft 1740 may be greater than the first eccentric distance r1 (refer to FIG. 16) between the eccentric shaft 1670 and the driving shaft 1680.

Hereinafter, a detailed configuration of the magnet plate assembly will be described with reference to FIG. 17.

A magnet may be accommodated in the magnet plate assembly 1610, and the magnet plate assembly 1610 may comprise at least one magnet and an assembly of a plurality of plates.

As shown in FIG. 17, the magnet plate assembly 1610 may comprise a bearing plate 1620, a tension magnet plate 1630, and an assembly magnet plate 1640. The bearing plate 1620, the tension magnet plate 1630, and the assembly magnet plate 1640 may be located to overlap each other in a Z-axis direction.

The bearing 1660 may be mounted on the bearing plate 1620. The bearing 1660 may comprise an outer ring and an inner ring, the inner ring of the bearing 1660 may be fastened to the eccentric shaft 1670, which will be described later, by a fastening member such as a screw, and the outer ring of the bearing 1660 may be fastened to the bearing plate 1620 by a fastening member such as a screw.

The tension magnet plate 1630 may be located on a bottom surface of the bearing plate 1620. The tension magnet plate 1630 may accommodate a tension magnet 1632 thereon.

The assembly magnet plate 1640 may be located on a bottom surface of the tension magnet plate 1630.

A holding magnet 1642 and the assembly magnet 1644 may be accommodated in the assembly magnet plate 1640.

A space 1646 in which the holding magnet 1642 and the assembly magnet 1644 are accommodated may be formed in the assembly magnet plate 1640.

The assembly magnet plate 1640 may have an opening that is open in a vertical direction below the space 1646, and the assembly magnet 1644 may pass through an opening. An area of the opening may be smaller than the area of the space.

A protrusion may protrude from an upper circumference of the assembly magnet 1644, and a protrusion of the assembly magnet 1644 may be caught in a lower direction around the opening.

A lower portion of the assembly magnet 1644 may protrude below the opening.

A lower end of the assembly magnet 1644 may be in contact with an upper surface of the panel 1100.

The holding magnet 1642 and the assembly magnet 1644 may have the same polarity in cross-sections facing each other, and a repulsive force acts between the holding magnet 1642 and the assembly magnet 1644, and thus when another force is not applied from the outside, the holding magnet 1642 may be located apart from the assembly magnet 1644 by a predefined distance.

The holding magnet 1642 and the assembly magnet 1644 may function as a kind of buffer module. The holding magnet 1642 may be a buffer magnet for buffering the assembly magnet 1644. The assembly magnet plate 1642 may be a magnet that applies an attractive force to the semiconductor light emitting diode 1104.

Even if a contact surface of the panel 1100 in contact with the assembly apparatus 1000 is not uniform due to bending or the like, the assembly magnet 1644 may be in smooth contact with the contact surface of the panel 1100.

FIG. 18 is a view illustrating a vibration offset principle of an anti-vibration system according to the present embodiment.

The magnet head 1600 may move the magnet plate assembly 1610 along a first circular trajectory. The first circular trajectory is a circular trajectory having the first eccentric distance R 1 as a first radius.

The anti-vibration system 1700 may be located above the magnet plate assembly 1610 and may move the weight 1750 along the second circular trajectory. The second circular trajectory is a circular trajectory having the second eccentric distance R 2 as a second radius.

The magnet head 1600 and the anti-vibration system 1700 may move the magnet plate assembly 1610 and the weight 1750 in opposite phases (positions).

For example, as the magnet plate assembly 1610 is moved in the order of 1→2→3→4 as shown in FIG. 18, the weight 1750 may be moved in the order of 1'→2'→3'→4', which is a reverse phase of the magnet plate assembly 1610.

For example, when the magnet plate assembly 1610 is positioned at the rightmost side of the first circular trajectory, the weight 1750 may be positioned at the leftmost side of the second circular trajectory. When the magnet plate assembly 1610 is positioned at the rearmost side of the first circular trajectory, the weight 1750 may be positioned at the foremost side of the second circular trajectory. When the magnet plate assembly 1610 is positioned at the leftmost position of the first circular trajectory, the weight 1750 may be positioned at the rightmost side of the second circular trajectory. When the magnet plate assembly 1610 is positioned at the foremost side of the first circular trajectory, the weight 1750 may be located at the rearmost side of the second circular trajectory.

The magnet head 1600 and the anti-vibration system 1700 may move the magnet plate assembly 1600 and the weight 1650 such that a force F1 generated during rotation of the magnet plate assembly 1600 and a force F2 generated during rotation of the weight 1650 coincide with each other.

The weight of the magnet head 1600 may be m1, and in this case, the force F1 generated during rotation of the magnet plate assembly 1600 may be m1×a1. Here, a1 may be an acceleration of the magnet plate assembly 1600, and r1 needs to be increased to increase a1.

The weight of the anti-vibration system 1700 may be m2, and in this case, the force F2 generated during rotation of the weight 1650 may be m2×a2. Here, a2 may be an acceleration of the weight 1650, and r2 needs to be increased to increase a2.

In the assembly apparatus 1000, the two forces F1 and F2 may be the same, and to minimize m2, r2 may be increased. That is, r2 may be formed to be greater than r1.

The above-disclosed subject matter is to be considered illustrative, and not restrictive, and the appended claims are intended to cover all such modifications, enhancements, and other embodiments, which fall within the true spirit and scope of the present disclosure.

Thus, the embodiment of the present disclosure is to be considered illustrative, and not restrictive, and the technical spirit of the present disclosure is not limited to the foregoing embodiment.

Therefore, the scope of the present disclosure is defined not by the detailed description of the disclosure but by the appended claims, and all differences within the scope will be construed as being comprised in the present disclosure.

What is claimed:

1. An assembly apparatus comprising:
    a main frame;
    a magnet head located on the main frame and configured to magnetically assemble a semiconductor light emitting diode to a panel; and
    an anti-vibration system located on the main frame and configured to offset vibration of the magnet head,
    wherein the magnet head comprises a magnet plate assembly comprising a magnet configured to apply an attractive force to the semiconductor light emitting diode, and
    the anti-vibration system comprises a weight positioned above the magnet plate assembly.

2. The assembly apparatus of claim 1, wherein the magnet head moves the magnet plate assembly along a first circular trajectory,
    the anti-vibration system moves the weight along a second circular trajectory,
    the first circular trajectory has a first radius,
    the second circular trajectory has a second radius, and
    the second radius is greater than the first radius.

3. An assembly apparatus comprising:
    a main frame;
    a magnet head located on the main frame and configured to magnetically assemble a semiconductor light emitting diode to a panel; and
    an anti-vibration system located on the main frame and configured to offset vibration of the magnet head,
    wherein the anti-vibration system comprises:
    an anti-vibration frame coupled to the main frame;
    a bracket installed on the anti-vibration frame;
    an anti-vibration motor installed in the bracket;
    an anti-vibration shaft rotated by the anti-vibration motor; and
    a weight eccentrically connected to the anti-vibration shaft.

4. The assembly apparatus of claim 3, wherein the magnet head comprises:
    a magnet plate assembly; and
    a plurality of driving devices connected to the magnet plate assembly and spaced apart from each other.

5. The assembly apparatus of claim 4, wherein the main frame comprises:
    an inner frame; and
    a side frame protruding from the inner frame,
    wherein the anti-vibration system is located inside the inner frame, and
    the plurality of driving devices are each located on the side frame.

6. The assembly apparatus of claim 4, wherein each of the plurality of driving devices comprises:
    a bearing installed on the magnet plate assembly;
    an eccentric shaft supported by the bearing;
    a lower coupler having the eccentric shaft eccentrically connected thereto;
    a driving shaft connected to the lower coupler;
    an upper coupler connected to the driving shaft; and
    a head motor configured to rotate the upper coupler.

7. The assembly apparatus of claim 6, wherein an eccentric distance between the weight and the anti-vibration shaft is greater than an eccentric distance between the eccentric shaft and the driving shaft.

8. The assembly apparatus of claim 6, wherein the anti-vibration shaft and the driving shaft are parallel to each other.

9. The assembly apparatus of claim 6, wherein a rotation direction of the anti-vibration shaft and a rotation direction of the driving shaft are the same.

10. The assembly apparatus of claim 1, further comprising a driver configured to move the assembly apparatus in a vertical direction and a horizontal direction.

11. The assembly apparatus of claim 10, further comprising a support connected to the driver and the main frame,
wherein the anti-vibration system is configured to offset vibration of the driver and the support.

12. The assembly apparatus of claim 11, wherein the support includes:
a first support frame connected to a first portion of the driver, and
a second support frame connected to a second portion of the driver.

13. The assembly apparatus of claim 11, wherein the support is connected to the magnet head, and
wherein the magnet head is located under the main frame with respect to the vertical direction.

14. The assembly apparatus of claim 1, wherein the main frame includes:
a lower frame located on the magnet plate assembly,
an upper frame, and
a plurality of pillar frames connecting the lower frame and the upper frame.

15. The assembly apparatus of claim 14, wherein the anti-vibration system is located in between the lower frame and the upper frame.

16. The assembly apparatus of claim 14, wherein the plurality of pillar frames are located on opposite sides of the main frame from each other.

17. The assembly apparatus of claim 14, wherein the magnet head further comprises a plurality of driving devices connected to the magnet plate assembly and spaced apart from each other, and
wherein the plurality of driving devices are located outside of the main frame.

18. The assembly apparatus of claim 17, wherein the main frame further includes side frames, and
wherein the plurality of driving devices are located in between the side frames.

19. The assembly apparatus of claim 18, wherein each of the side frames includes an L-shaped bracket,
wherein a horizontal portion of the L-shaped bracket is located on the magnet plate assembly, and
wherein a vertical portion of the L-shaped bracket is located on one of the plurality of pillar frames.

20. The assembly apparatus of claim 18, wherein more than one driving device of the plurality of driving devices is located in between adjacent side frames.

* * * * *